US012787584B2

(12) United States Patent
Choi et al.

(10) Patent No.: US 12,787,584 B2
(45) Date of Patent: Nov. 3, 2026

(54) DISPLAY DEVICE

(71) Applicant: Samsung Display Co., LTD., Yongin-si (KR)

(72) Inventors: Yoonsun Choi, Hwaseong-si (KR); Beomyeol Park, Suwon-si (KR); Kiho Bang, Hwaseong-si (KR); Wonsuk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 608 days.

(21) Appl. No.: 18/298,879

(22) Filed: Apr. 11, 2023

(65) Prior Publication Data

US 2023/0422565 A1 Dec. 28, 2023

(30) Foreign Application Priority Data

Jun. 28, 2022 (KR) ........................ 10-2022-0079232

(51) Int. Cl.
*H10K 59/131* (2023.01)
*H10K 59/121* (2023.01)
*H10K 59/80* (2023.01)

(52) U.S. Cl.
CPC ..... *H10K 59/1315* (2023.02); *H10K 59/1213* (2023.02); *H10K 59/1216* (2023.02); *H10K 59/871* (2023.02); *H10K 59/873* (2023.02)

(58) Field of Classification Search
CPC ........... H10K 59/1315; H10K 59/1213; H10K 59/1216; H10K 59/871; H10K 59/873; H10K 59/124; H10K 59/8722; H10K 59/131; H10K 59/122; H10K 50/8426; H10K 50/844; H10K 59/123; H10K 77/111; H10K 2102/311; H10D 86/441; H10D 86/60
See application file for complete search history.

(56) References Cited

U.S. PATENT DOCUMENTS

2017/0062408 A1* 3/2017 Chung ................. G09G 3/3225
2017/0287937 A1* 10/2017 Ka ....................... H10K 59/131
(Continued)

FOREIGN PATENT DOCUMENTS

CN 110286532 A * 9/2019 ......... G02F 1/13452
KR 10-2019-0128030 A 11/2019
(Continued)

OTHER PUBLICATIONS

Translation for CN-110286532-A (Year: 2019).*

*Primary Examiner* — Jacob Y Choi
*Assistant Examiner* — Ashley Nicole Blackwell
(74) *Attorney, Agent, or Firm* — Womble Bond Dickinson (US) LLP

(57) ABSTRACT

A display device comprises a pixel array in a display area, a fan-out wiring in a peripheral area adjacent to the display area, and in a sealing area surrounding the display area, and including a first fan-out line at a first layer, and a second fan-out line at a second layer, a transmission wiring in the sealing area, and including a first transmission line at the first layer, and a second transmission line at the second layer and electrically connected to the first transmission line, the first transmission line and the second transmission line being between the first fan-out line and the second fan-out line in a plan view, and a sealing member in the sealing area.

20 Claims, 5 Drawing Sheets

(56) References Cited

U.S. PATENT DOCUMENTS

| | | | | |
|---|---|---|---|---|
| 2020/0411558 | A1* | 12/2020 | Zhang | H10K 59/353 |
| 2021/0159298 | A1* | 5/2021 | Youn | H10K 59/1216 |
| 2021/0265450 | A1* | 8/2021 | Oh | H10K 59/1216 |
| 2022/0028956 | A1* | 1/2022 | You | H10K 59/124 |
| 2022/0408548 | A1* | 12/2022 | Niu | H05K 1/189 |

FOREIGN PATENT DOCUMENTS

| | | | |
|---|---|---|---|
| KR | 10-2079256 | B1 | 2/2020 |
| KR | 10-2124041 | B1 | 6/2020 |
| KR | 10-2021-0109089 | A | 9/2021 |
| KR | 10-2022-0014365 | A | 2/2022 |

* cited by examiner

DISPLAY DEVICE

CROSS-REFERENCE TO RELATED APPLICATION

This application claims priority to, and the benefit of, Korean Patent Application No. 10-2022-0079232 filed on Jun. 28, 2022 in the Korean Intellectual Property Office (KIPO), the entire disclosure of which is incorporated herein by reference.

BACKGROUND

1. Field

The present disclosure relates to a wiring of a display device.

2. Description of the Related Art

A display device includes a display panel, and a driving unit for providing a driving signal to the display panel. The driving unit may be included in a driving chip, and the driving chip may be directly coupled to a substrate of the display panel, or may be connected to a pad unit of the display panel through a flexible circuit film or the like.

The display device may include a transmission wiring for transmitting a signal or power from the pad unit to a pixel array of the display panel. To reduce the dead space (or bezel) of the display device, it may be suitable to reduce the size of a region in which the transmission wiring is located.

In addition, for the transmission wiring to have a relatively low resistance, the width of the transmission wiring needs to be sufficiently large.

SUMMARY

An aspect of the present disclosure is to provide a display device with reduced dead space and improved reliability.

However, the aspect of the present disclosure is not limited to the aspect described above, and may be variously expanded without departing from the spirit and scope of the present disclosure.

To achieve the above aspects of the present disclosure, a display device according to embodiments of the present disclosure may include a pixel array in a display area, a fan-out wiring in a peripheral area adjacent to the display area, and in a sealing area surrounding the display area, and including a first fan-out line at a first layer, and a second fan-out line at a second layer, a transmission wiring in the sealing area, and including a first transmission line at the first layer, and a second transmission line at the second layer and electrically connected to the first transmission line, the first transmission line and the second transmission line being between the first fan-out line and the second fan-out line in a plan view, and a sealing member in the sealing area.

The first transmission line may include a first non-overlapping portion that does not overlap the second transmission line in the sealing area, wherein the second transmission line includes a second non-overlapping portion that does not overlap the first transmission line in the sealing area.

The first non-overlapping portion may be adjacent to the second fan-out line in plan view, wherein the second non-overlapping portion is adjacent to the first fan-out line in plan view.

The fan-out wiring and the transmission wiring may extend in a first direction from the sealing area.

The first transmission line may include an overlapping portion that overlaps the second transmission line in the sealing area in plan view, a width of the overlapping portion in a second direction crossing the first direction being larger than a width of the first fan-out line in the second direction in the sealing area, and being larger than a width of the second fan-out line in the second direction in the sealing area.

The transmission wiring and the fan-out wiring may be electrically insulated from each other.

The pixel array may include a semiconductor layer, a first inorganic insulating layer covering the semiconductor layer, a first conductive layer above the first inorganic insulating layer, and including a gate pattern overlapping at least a portion of the semiconductor layer, a second inorganic insulating layer above the first inorganic insulating layer, and covering the first conductive layer, a second conductive layer above the second inorganic insulating layer, and including a capacitor pattern overlapping at least a portion of the first conductive layer, a third inorganic insulating layer above the second inorganic insulating layer, and covering the second conductive layer, conductive layers above the third inorganic insulating layer, and organic insulating layers above the third inorganic insulating layer, and respectively electrically insulating the conductive layers from each other.

The gate pattern may be at the first layer, wherein the capacitor pattern is at the second layer.

The organic insulating layers may define an opening in the sealing area.

The sealing member may be in the opening.

The pixel array may cover the conductive layers and the organic insulating layers, and further includes a first inorganic encapsulation layer, an organic encapsulation layer above the first inorganic encapsulation layer, and a second inorganic encapsulation layer above the organic encapsulation layer.

The first inorganic encapsulation layer and the second inorganic encapsulation layer may cover the opening in the sealing area.

The first inorganic encapsulation layer may directly contact the second inorganic encapsulation layer throughout the sealing area.

The peripheral area may include a first peripheral area between the sealing area and the display area, a second peripheral area surrounding the sealing area, and a bending area adjacent to the second peripheral area.

The first transmission line and the second transmission line may extend to the first peripheral area, and may be electrically connected to each other by a first transmission electrode above the fan-out wiring and the transmission wiring in the first peripheral area.

The first transmission line and the second transmission line may extend to the second peripheral area, and may be electrically connected to each other by a second transmission electrode above the fan-out wiring and by the transmission wiring in the second peripheral area.

To achieve the above aspects of the present disclosure, a display device according to embodiments of the present disclosure may include a pixel array in a display area, a fan-out wiring in a peripheral area adjacent to the display area, and in a sealing area surrounding the display area, and including a first fan-out line, a second fan-out line, a third fan-out line, and a fourth fan-out line that extend in a first direction, and that are alternately arranged in a second direction crossing the first direction in the sealing area, a transmission wiring that is in the sealing area and includes a first transmission wiring extending in the first direction and between the first fan-out line and the second fan-out line when viewed in a plan view, and a second transmission wiring between the third fan-out line and the fourth fan-out line when viewed in plan view, and a sealing member in the sealing area.

The first fan-out line and the third fan-out line may be at a first layer, wherein the second fan-out line and the fourth fan-out line are at a second layer.

The first transmission wiring may include a first transmission line at the first layer, and a second transmission line at the second layer and electrically connected to the first transmission line, wherein the second transmission wiring includes a third transmission line at the first layer, and a fourth transmission line at the second layer and electrically connected to the third transmission line.

A spacing distance between the second fan-out line and the third fan-out line in the second direction in the sealing area in plan view may be less than a spacing distance between the first fan-out line and the second fan-out line in the second direction in the sealing area in plan view, and may be less than a spacing distance between the third fan-out line and the fourth fan-out line in the second direction in the sealing area in plan view.

A display device according to embodiments of the present disclosure can include a fan-out wiring including a first fan-out line and a second fan-out line located on a layer different from a layer of the first fan-out line, and a transmission wiring which is located between the first fan-out line and the second fan-out line when viewed in a plan view and includes a first transmission line and a second transmission line electrically connected to each other. Accordingly, a size of the area where the transmission wiring, the first fan-out line, and the second fan-out line are located when viewed in a plan view may be relatively decreased to reduce a dead space of the display device.

A display device according to embodiments of the present disclosure may include a fan-out wiring which extends in a first direction and includes a first fan-out line, a second fan-out line, a third fan-out line, and a fourth fan-out line alternately arranged in a second direction crossing the first direction; and a transmission wiring which includes a first transmission wiring located between the first fan-out line and the second fan-out line when viewed in a plan view, and a second transmission wiring located between the third fan-out line and the fourth fan-out line when viewed in a plan view. Accordingly, a size of the area where the first to fourth fan-out lines, and the first and second transmission wirings are located when viewed in a plan view may be relatively decreased to reduce a dead space of the display device.

However, the effect of the present disclosure is not limited to the aspect described above, and may be variously expanded without departing from the spirit and scope of the present disclosure.

DETAILED DESCRIPTION

Figure 1:
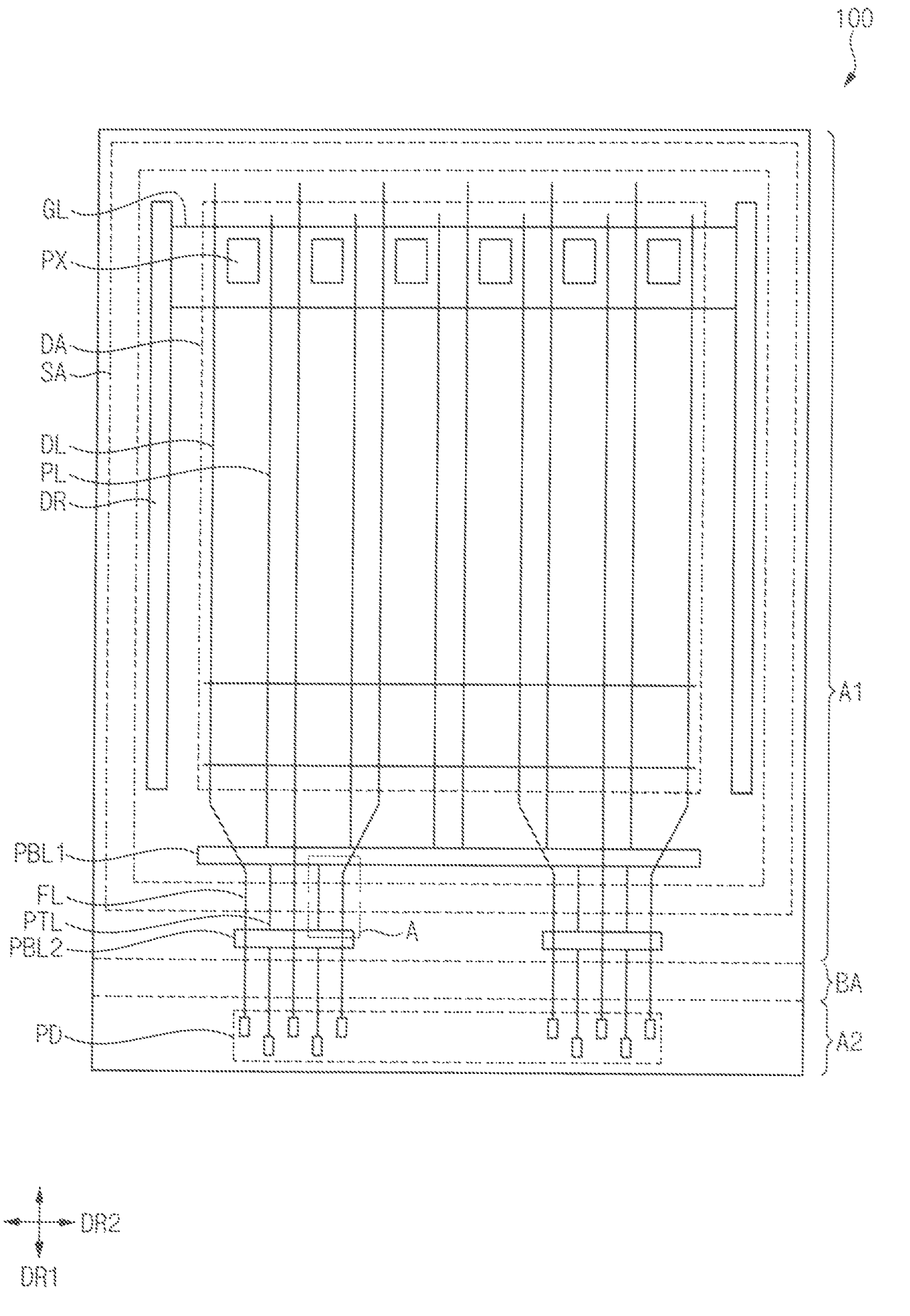
FIG. 1 is a plan view for explaining an array substrate of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view for explaining an array substrate of a display device according to one or more embodiments of the present disclosure.

Referring to FIG. 1, the display device according to one or more embodiments of the present disclosure may include a display panel. The display panel may include an array substrate 100.

The array substrate 100 may include a display area DA, and a peripheral area surrounding the display area DA. The display area DA may display an image by generating light, or by adjusting transmittance of the light provided from an external light source. The peripheral area may be defined as an area that does not display an image.

In one or more embodiments, the display device may be an organic light-emitting display device. For example, a pixel array defined by a pixel PX including a light-emitting element may be located in the display area DA of the array substrate 100 so as to generate light according to a driving signal. A signal line and a power line for providing a driving signal and power to the pixel PX may be located in the display area DA. For example, a gate line GL extending in a second direction DR2 and providing a gate signal to the pixel PX, a data line DL extending in a first direction DR1 crossing the second direction DR2 and providing a data signal to the pixel PX, and a power line PL extending in the first direction DR1 and supplying power to the pixel PX may be located in the display area DA.

A transmission wiring for transmitting a driving signal or power to the display area DA, a circuit unit for generating the drive signal, and the like may be located in the peripheral area. For example, a driving unit DR for generating the gate signal, a fan-out wiring FL for transmitting the data signal to the data line DL, a first transmission electrode PBL1 and a second transmission electrode PBL2 for transmitting power to the power line PL, a transmission wiring PTL electrically connecting the first transmission electrode PBL1 and the second transmission electrode PBL2, and the like may be located in the peripheral area.

In one or more embodiments, the peripheral area may include a sealing area SA in which a sealing member (SM in FIG. 4) is located. The sealing area SA may have a shape surrounding the display area DA.

The transmission wiring may extend from one side of the peripheral area and may be connected to a pad unit PD. Connection pads located on the pad unit PD may be electrically connected to an external driving device. Accordingly, the transmission wiring may be electrically connected to the external driving device to receive a driving signal, a control signal, power, and the like. The external driving device may include a driving chip, a flexible circuit film on which the driving chip is mounted, a printed circuit board on which a control unit for providing a control signal to the driving chip is mounted, and the like.

In one or more embodiments, the peripheral area may include a bending area BA. The bending area BA may be located between a first area A1, which includes the display area DA and the sealing area SA, and a second area A2 including the pad unit PD. An array substrate 100 may be bent in the bending area BA. In this case, the pad unit PD may be positioned on a rear surface of the array substrate 100.

Figure 2:
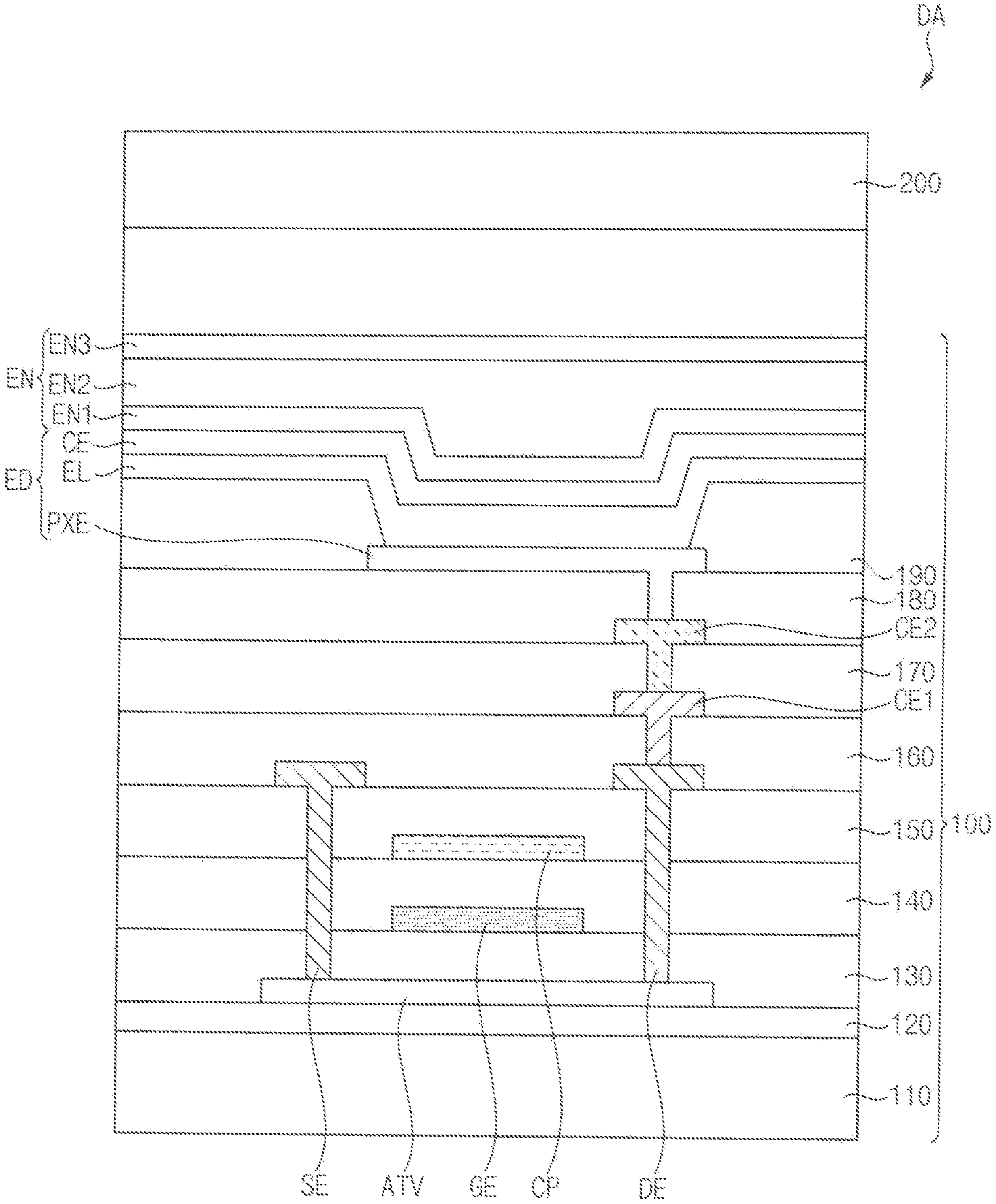
FIG. 2 is a sectional view showing a display area of a display device according to one or more embodiments of the present disclosure.

FIG. 2 is a sectional view showing a display area of a display device according to one or more embodiments of the present disclosure.

Referring to FIG. 2, in the display area DA, the display device may include an array substrate 100 including a base substrate 110, a buffer layer 120, a semiconductor layer ATV, a first inorganic insulating layer 130, a first conductive layer, a second inorganic insulating layer 140, a second conductive layer, a third inorganic insulating layer 150, a third conductive layer, a first organic insulating layer 160, a fourth conductive layer, a second organic insulating layer 170, a fifth conductive layer, a third organic insulating layer 180, a pixel defining layer 190, a light-emitting diode (ED), and an encapsulation layer (EN), and also may include a cover substrate 200 located on the array substrate 100. In this case, the light-emitting diode ED may include a pixel electrode PXE, a light-emitting material EL, and a common electrode CE, and the encapsulation layer EN may include a first inorganic encapsulation layer EN1, an organic encapsulation layer EN2, and a second inorganic encapsulation layer EN3.

The base substrate 110 may include glass, quartz, a polymer material, etc.

The buffer layer 120 may be located on the base substrate 110. The buffer layer 120 may reduce or block penetration of foreign substances, moisture, or air from the base substrate 110, and may flatten an upper surface of the base substrate 110. The buffer layer 120 may include an inorganic material, such as oxide, nitride, or the like.

The semiconductor layer ATV may be located on the buffer layer 120. The semiconductor layer ATV may include silicon or a metal oxide semiconductor. In one or more embodiments, the semiconductor layer ATV may include polycrystalline silicon (polysilicon), and may be doped with an N-type impurity or a P-type impurity.

The first inorganic insulating layer 130 may be located on the buffer layer 120, and may cover the semiconductor layer ATV.

The first conductive layer may be located on the first inorganic insulating layer 130. The first conductive layer may include a gate pattern GE overlapping at least a portion of the semiconductor layer ATV.

The second inorganic insulating layer 140 may be located on the first inorganic insulating layer 130, and may cover the first conductive layer.

The second conductive layer may be located on the second inorganic insulating layer 140. The second conductive layer may include a capacitor pattern CP overlapping at least a portion of the first conductive layer. In one or more embodiments, the capacitor pattern CP may overlap the gate pattern GE so as to form a capacitor.

The third inorganic insulating layer 150 may be located on the second inorganic insulating layer 140, and may cover the second conductive layer.

The third conductive layer may be located on the third inorganic insulating layer 150. The third conductive layer may include a source electrode SE and a drain electrode DE. The source electrode SE and the drain electrode DE may be respectively and electrically connected to at least a portion of the semiconductor layer ATV. In this case, the semiconductor layer ATV, the gate pattern GE, the source electrode SE, and the drain electrode DE may define a transistor.

The first organic insulating layer 160 may be located on the third inorganic insulating layer 150, and may cover the third conductive layer.

The fourth conductive layer may be located on the first organic insulating layer 160. The fourth conductive layer may be located on a first bridge pattern CE1. In one or more embodiments, the first bridge pattern CE1 may be electrically connected to the drain electrode DE.

The second organic insulating layer 170 may be located on the first organic insulating layer 160, and may cover the fourth conductive layer.

The fifth conductive layer may be located on the second organic insulating layer 170. The fifth conductive layer may be located on a second bridge pattern CE2. In one or more embodiments, the second bridge pattern CE2 may be electrically connected to the first bridge pattern CE1.

The third organic insulating layer 180 may be located on the second organic insulating layer 170, and may cover the fifth conductive layer.

The first inorganic insulating layer 130, the second inorganic insulating layer 140, and the third inorganic insulating layer 150 may respectively include silicon oxide, silicon nitride, silicon oxynitride, or a combination thereof, and may also include insulating metal oxides, such as aluminum oxide, tantalum oxide, hafnium oxide, zirconium oxide, titanium oxide, and the like. For example, the first inorganic insulating layer 130, the second inorganic insulating layer 140, and the third inorganic insulating layer 150 may respectively have a single-layer or multi-layer structure of silicon nitride or silicon oxide, and may have mutually different structures.

The first organic insulating layer 160, the second organic insulating layer 170, and the third organic insulating layer 180 may respectively include organic insulating materials, such as phenol resin, acrylic resin, polyimide resin, polyamide resin, siloxane resin, epoxy resin, etc.

The first conductive layer and the second conductive layer may include metal, metal alloy, metal nitride, conductive metal oxide, etc. For example, the first conductive layer and the second conductive layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layer structure or a multi-layer structure including mutually different metal layers.

In one or more embodiments, the first conductive layer and the second conductive layer may respectively have a single-layer structure of molybdenum, titanium, or copper or a multi-layer structure thereof. Preferably, the first conductive layer and the second conductive layer may respectively have a single-layer structure of molybdenum or titanium, or a multi-layer structure thereof.

The third conductive layer, the fourth conductive layer and the fifth conductive layer may respectively include metal, metal alloy, metal nitride, conductive metal oxide, etc. For example, the first conductive layer and the second conductive layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layer structure or a multi-layer structure including mutually different metal layers.

In one or more embodiments, the third conductive layer, the fourth conductive layer, and the fifth conductive layer may include a material having a melting point that is lower than that of the first conductive layer and the second conductive layer. For example, the third conductive layer, the fourth conductive layer, and the fifth conductive layer may respectively have a multi-layer structure including at least aluminum.

The pixel electrode PXE may be located on the third organic insulating layer 180. In one or more embodiments, the pixel electrode PXE may be referred to as an anode electrode.

The pixel defining layer 190 may be located on the third organic insulating layer 180, and may define a pixel opening exposing at least a portion of the pixel electrode PXE. The pixel defining layer 190 may include an organic insulating material.

The light-emitting material EL may be located on the pixel electrode PXE within the pixel opening. In one or more embodiments, the light-emitting material EL may extend from within the pixel opening onto the pixel defining layer 190. The light-emitting material EL may include at least an organic light-emitting layer.

The common electrode CE may cover the light-emitting material EL and the pixel defining layer PDL. In one or more embodiments, the common electrode CE may be referred to as a cathode electrode.

The encapsulation layer EN may cover the common electrode CE. For example, the first inorganic encapsulation layer EN1 may cover the common electrode CE, the organic encapsulation layer EN2 may cover the first inorganic encapsulation layer EN1, and the second inorganic encapsulation layer EN3 may cover the organic encapsulation layer EN2. The first inorganic encapsulation layer EN1 and the second inorganic encapsulation layer EN3 may respectively include an inorganic insulating material, and the organic encapsulation layer EN2 may include an organic insulating material.

A cover substrate 200 may be located on the encapsulation layer EN. The cover substrate 200 may include glass, quartz, sapphire, a polymer material, etc. The cover substrate 200 may be coupled to the array substrate 100 by a sealing member (SM in FIG. 4) to be described later. In this case, a space between the cover substrate 200 and the array substrate 100 may be maintained in a vacuum state, filled with gas, or filled with a filling member. In one or more embodiments, the filling member may include an organic layer, an inorganic layer, or a combination thereof.

Figure 3:
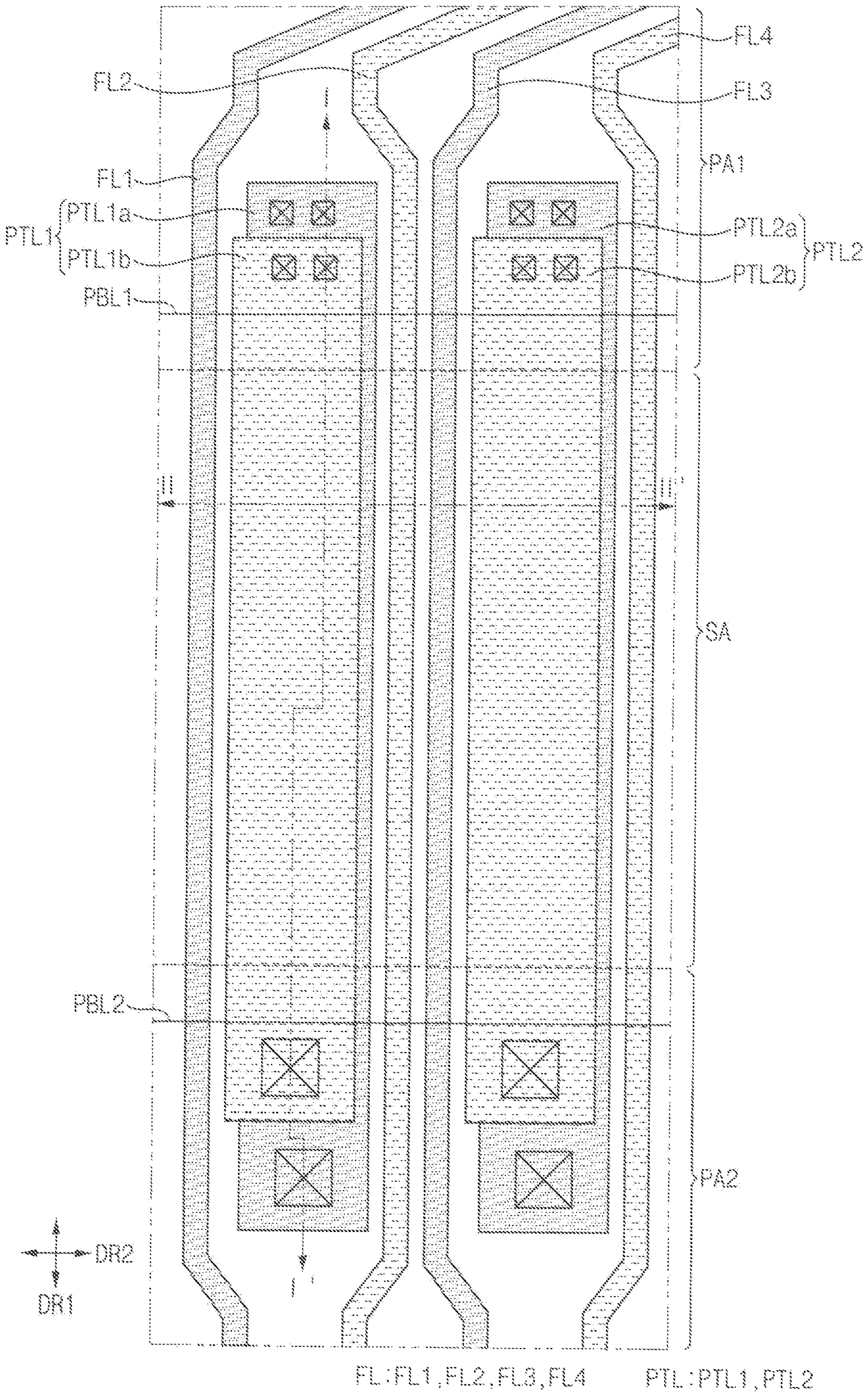
FIG. 3 is a plan view showing an enlarged region A of FIG. 1.
Figure 4:
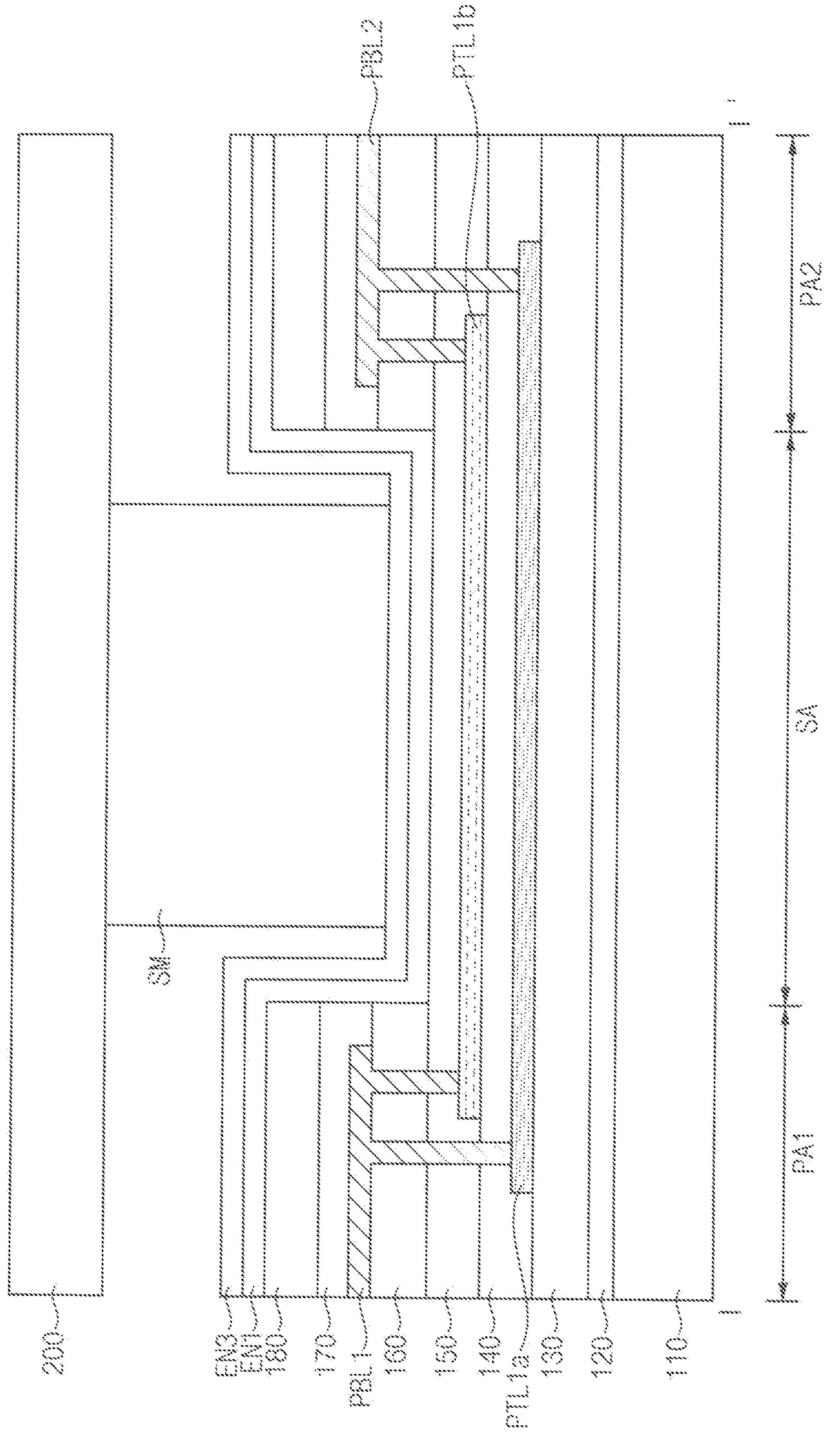
FIG. 4 is a sectional view taken along the line I-I' of FIG. 3.
Figure 5:
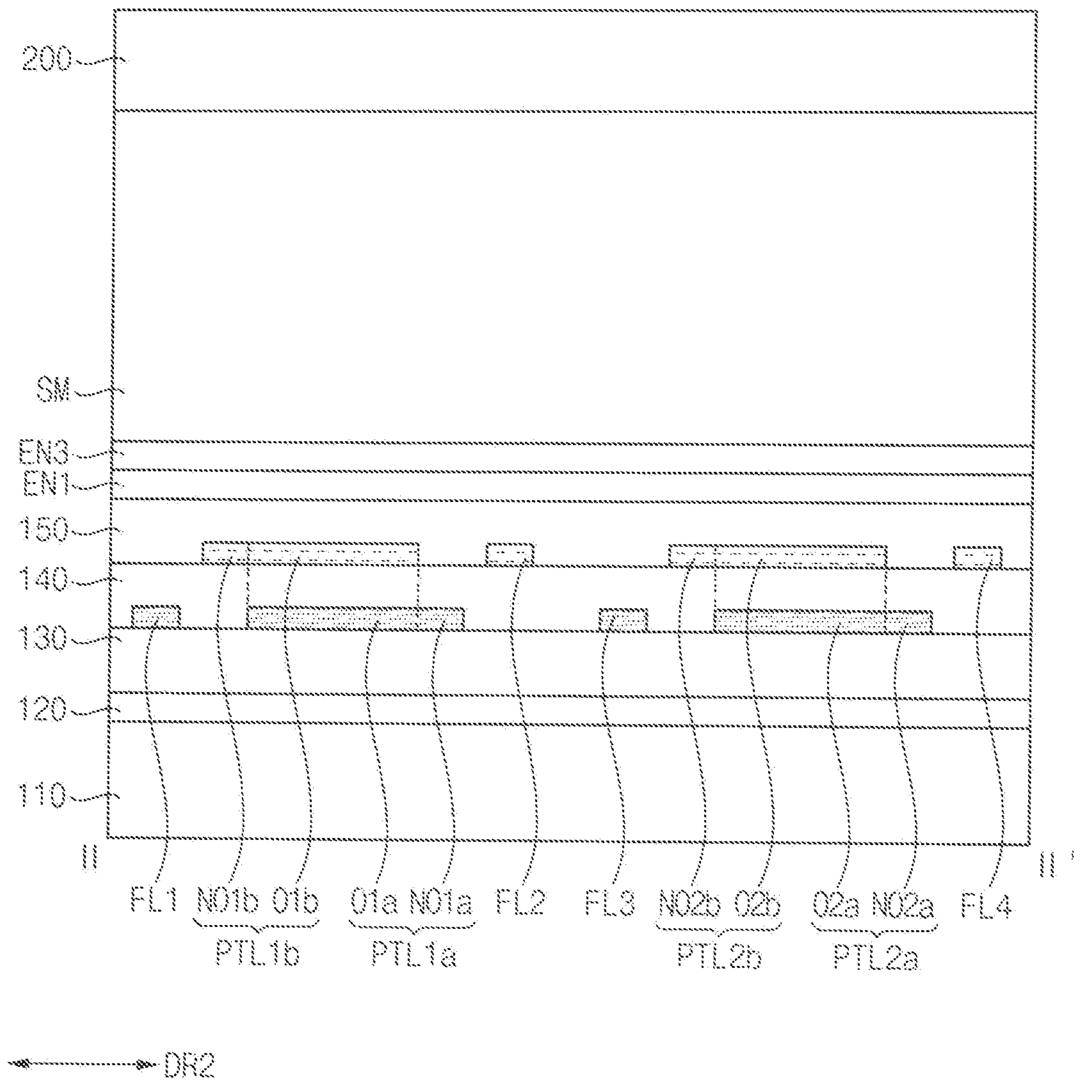
FIG. 5 is a sectional view taken along the line II-II' of FIG. 3.

FIG. 3 is a plan view showing an enlarged region A of FIG. 1. FIG. 4 is a sectional view taken along the line I-I' of FIG. 3. FIG. 5 is a sectional view taken along the line II-II' of FIG. 3.

Referring to FIGS. 1 and 3, the fan-out wiring FL include a first fan-out line FL1, a second fan-out line FL2, a third fan-out line FL3, and a fourth fan-out line FL4, and the transmission wiring PTL may include a first transmission line PTL1 and a second transmission line PTL2. The first transmission wiring PTL1 may include a first transmission line PTL1*a* and a second transmission line PTL1*b*, and the second transmission wiring PTL2 may include a third transmission line PTL2*a* and a fourth transmission line PTL2*b*.

The first to fourth fan-out lines FL1, FL2, FL3, and FL4 may be located in at least the sealing area SA. The first to fourth fan-out lines FL1, FL2, FL3, and FL4 may be alternately arranged in a second direction DR2. In addition, the first to fourth fan-out lines FL1, FL2, FL3, and FL4 may extend in a first direction DR1 in the sealing area SA.

The first to fourth fan-out lines FL1, FL2, FL3, and FL4 may extend from the sealing area SA to a first peripheral area PA1, which is defined as an area between the sealing area SA and the display area DA, and may be electrically connected to the data line DL.

In addition, the first to fourth fan-out lines FL1, FL2, FL3, and FL4 may extend from the sealing area SA to the second peripheral area PA2, which is defined as an area surrounding the sealing area SA. In this case, the first to fourth fan-out lines FL1, FL2, FL3, and FL4 may further extend to the second area A2 and the bending area BA adjacent to the second peripheral area PA2 so as to be electrically connected to the pad unit PD.

The first to fourth transmission lines PTL1*a*, PTL1*b*, PTL2*a*, and PTL2*b* may be located in at least the sealing area SA. In the sealing area SA, the first to fourth transmission lines PTL1*a*, PTL1*b*, PTL2*a*, and PTL2*b* may extend in a first direction DR1.

The first transmission line PTL1*a* and the second transmission line PTL1*b* may partially overlap each other when viewed in a plan view. In addition, the first transmission line PTL1*a* and the second transmission line PTL1*b* may be located between the first fan-out line FL1 and the second fan-out line FL2 when viewed in a plan view. In this case, the first transmission line PTL1*a* and the second transmission line PTL1*b* may be spaced apart from the first fan-out line FL1 and the second fan-out line FL2 when viewed in a plan view.

The third transmission line PTL2*a* and the fourth transmission line PTL2*b* may be located with substantially the same structure as that of the first transmission line PTL1*a* and the second transmission line PTL1*b*. For example, the third transmission line PTL2*a* and the fourth transmission line PTL2*b* may partially overlap each other when viewed in a plan view, and the third transmission line PTL2*a* and the fourth transmission line PTL2*b* may be located between the third fan-out line FL3 and the fourth fan-out line FL4 when viewed in a plan view.

The first to fourth transmission lines PTL1*a*, PTL1*b*, PTL2*a*, and PTL2*b* may extend from the sealing area SA to the first peripheral area PA1. In addition, the first to fourth transmission lines PTL1*a*, PTL1*b*, PTL2*a*, and PTL2*b* may extend from the sealing area SA to the second peripheral area PA2.

In one or more embodiments, as shown in FIG. 3, the transmission wiring PTL may not be located between the second fan-out line FL2 and the third fan-out line FL3. In this case, in the sealing area SA, a spacing distance between the second fan-out line FL2 and the third fan-out line FL3 in the second direction DR2 when viewed in a plan view may be less than a spacing distance between the first fan-out line FL1 and the second fan-out line FL2 in the second direction DR2 when viewed in a plan view, and may be less than a spacing distance between the third fan-out line FL3 and the fourth fan-out line FL4 in the second direction DR2 when viewed in a plan view.

Referring to FIGS. 3 and 4, the base substrate 110, the buffer layer 120, the first inorganic insulating layer 130, the second inorganic insulating layer 140, and the third inorganic insulating layer 150 described with reference to FIG. 2 may be located in the first peripheral area PA1, the sealing area SA, and the second peripheral area PA2.

In addition, the first organic insulating layer 160, the second organic insulating layer 170, and the third organic insulating layer 180 described with reference to FIG. 2 may be located in the first peripheral area PA1 and the second peripheral area PA2, and the first organic insulating layer 160, the second organic insulating layer 170, and the third organic insulating layer 180 may define an opening in the sealing area SA. A sealing member SM may be located in the opening defined in the sealing area SA, and the cover substrate 200 may be located on the sealing member SM. In this case, the sealing member SM may provide adhesive force to the cover substrate 200.

In one or more embodiments, the first inorganic encapsulation layer EM1 and the second inorganic encapsulation layer EN3 described with reference to FIG. 2 may be respectively and entirely located in the first peripheral area PA1, the sealing area SA, and a second peripheral area PA2. For example, the first inorganic encapsulation layer EM1 and the second inorganic encapsulation layer EN3 may be respectively located on the third organic insulating layer 180 in the first peripheral area PA1 and the second peripheral area PA2, and may cover the opening (or may cover side surfaces of the first to third organic insulating layers 160, 170, and 180 defining the opening) in the sealing area SA. In this case, the first inorganic encapsulation layer EN1 and the second inorganic encapsulation layer EN3 may come into direct contact with each other in the sealing area SA.

The first transmission line PTL1*a* may be located on the first inorganic insulating layer 130, and the second inorganic insulating layer 140 may cover the first transmission line PTL1*a*. In other words, the first transmission line PTL1*a* may be located on the same layer as the gate pattern GE described with reference to FIG. 2. In other words, the first conductive layer described with reference to FIG. 2 may further include the first transmission line PTL1*a*.

The second transmission line PTL1*b* may be located on the second inorganic insulating layer 140, and the third inorganic insulating layer 150 may cover the second transmission line PTL1*b*. In other words, the second transmission line PTL1*b* may be located on the same layer as the capacitor pattern CE described with reference to FIG. 2. That is to say, the second conductive layer described with reference to FIG. 2 may further include the second transmission line PTL1*b*.

In the first peripheral area PA1, the first transmission electrode PBL1 may be located on the first organic insulating layer 160. In other words, the first transmission electrode PBL1 may be located on the same layer as the first bridge pattern CE1 described with reference to FIG. 2. That is to say, the fourth conductive layer described with reference to FIG. 2 may further include the first transmission electrode PBL1.

The first transmission electrode PBL1 may come into electrical contact with the first transmission line PTL1*a* and the second transmission line PTL1*b*, respectively, so as to electrically connect the first transmission line PTL1*a* and the second transmission line PTL1*b*. In addition, as shown in FIG. 3, the first transmission electrode PBL1 may further come into electrical contact with the third transmission line PTL2*a* and the fourth transmission line PTL2*b*, respectively, and thus the first to fourth transmission lines PTL1*a*, PTL1*b*, PTL2*a* and PTL2*b* may be electrically connected to each other.

The first transmission electrode PBL1 may be electrically connected to the power line PL located in the display area DA. For example, the power line PL may extend from the display area DA to the first peripheral area PA1 and may be electrically connected to the first transmission electrode PBL1.

Although FIG. 4 corresponds to one or more embodiments in which the first transmission electrode PBL1 is located on the same layer as the first bridge pattern CE1, the present disclosure is not limited thereto. For example, the first transmission electrode PBL1 may be located on the same layer as the drain electrode DE or the second bridge pattern CE2, and may respectively come into electrical contact with the first to fourth transmission lines PTL1*a*, PTL1*b*, PTL2*a* and PTL2*b* in the first peripheral area PA1.

In the second peripheral area PA2, the second transmission electrode PBL2 may be located on the first organic insulating layer 160. In other words, the second transmission electrode PBL2 may be located on the same layer as the first bridge pattern CE1 described with reference to FIG. 2. That is to say, the fourth conductive layer described with reference to FIG. 2 may further include the second transmission electrode PBL2.

The second transmission electrode PBL2 may come into electrical contact with the first transmission line PTL1*a* and with the second transmission line PTL1*b* so as to electrically connect the first transmission line PTL1*a* and the second transmission line PTL1*b*. In addition, as shown in FIG. 3, the second transmission electrode PBL2 may further come into electrical contact with the third transmission line PTL2*a* and with the fourth transmission line PTL2*b*, and thus the first to fourth transmission lines PTL1*a*, PTL1*b*, PTL2*a* and PTL2*b* may be electrically connected to each other.

The second transmission electrode PBL2 may be electrically connected to the pad unit PD located in the second area A2. For example, the second transmission electrode PBL2 and the pad unit PD may be electrically connected by a bridge wiring that extends from the bending area BA in the first direction DR1 and that is electrically connected to the second transmission electrode PBL2 and to the pad unit PD.

Although FIG. 4 corresponds to one or more embodiments in which the second transmission electrode PBL2 is located on the same layer as the first bridge pattern CE1, the present disclosure is not limited thereto. For example, the second transmission electrode PBL2 may be located on the same layer as the drain electrode DE or the second bridge pattern CE2, and may come into electrical contact with the first to fourth transmission lines PTL1*a*, PTL1 b, PTL2*a* and PTL2*b* in the second peripheral area PA2.

Referring to FIGS. 3 and 5, the first fan-out line FL1 and the third fan-out line FL3 may be located on the first inorganic insulating layer 130, and the second inorganic insulating layer 140 may cover the first fan-out line FL1 and the third fan-out line FL3. In other words, the first fan-out line FL1 and the third fan-out line FL3 may be located on the same layer as the first transmission line PTL1*a* and the second transmission line PTL2*a*.

The second fan-out line FL2 and the fourth fan-out line FL4 may be located on the second inorganic insulating layer 140, and the third inorganic insulating layer 150 may cover the second fan-out line FL2 and the fourth fan-out line FL4. In other words, the second fan-out line FL2 and the fourth fan-out line FL4 may be located on the same layer as the second transmission line PTL1*b* and the fourth transmission line PTL2*b*.

In this case, the fan-out wiring FL and the transmission wiring PTL may be electrically insulated from each other by the first to third inorganic insulating layers 130, 140, and 150. For example, the first transmission line PTL1*a* and the second transmission line PTL1*b* may be respectively and electrically insulated from the first fan-out line FL1 and the second fan-out line FL2, respectively.

In the sealing area SA, the first transmission line PTL1*a* may include a first non-overlapping portion NO1*a* that does not overlap the second transmission line PTL1*b* when viewed in a plan view, and the second transmission line PTL1*b* may include a second non-overlapping portion NO1*b* that does not overlap the first transmission line PTL1*a* when viewed in a plan view. In other words, in the sealing area SA, the first transmission line PTL1*a* and the second transmission line PTL1*b* may partially overlap each other when viewed in a plan view.

In this case, the first non-overlapping portion NO1*a* may be adjacent to the second fan-out line FL2 when viewed in a plan view, and the second non-overlapping portion NO1*b* may be located adjacent to the first fan-out line FL1 when viewed in a plan view.

In the sealing area SA, the first transmission line PTL1*a* may include a first overlapping portion O1*a* that overlaps the second transmission line PTL1*b* when viewed in a plan view, and the second transmission line PTL1*b* may include a second overlapping portion NO1*b* that overlaps the first transmission line PTL1*a* when viewed in a plan view. The first overlapping portion O1*a* and the second overlapping portion O1*b* may have the same shape when viewed in a plan view.

The first overlapping portion O1*a* may have a width that is relatively larger than that of the first fan-out line FL1 and that of the second fan-out line FL2. For example, the width of the first overlapping portion O1*a* in the second direction DR2 may be larger than that of the first fan-out line FL1 in the second direction DR2, and may be larger than that of the second fan-out FL2 in the second direction DR2.

In the sealing area SA, the third transmission line PTL2*a* and the fourth transmission line PTL2*b* may have substantially the same structure as that of the first transmission line PTL1*a* and the second transmission line PTL2*b*.

In other words, the third transmission line PTL2*a* may include a third non-overlapping portion NO2*a* that does not overlap the fourth transmission line PTL2*b* when viewed in a plan view, and the fourth transmission line PTL2*b* may include a fourth non-overlapping portion NO2*b* that does not overlap the third transmission line PTL2*a* when viewed in a plan view. The third non-overlapping portion NO2*a* may be adjacent to the fourth fan-out line FL4 when viewed in a plan view, and the fourth non-overlapping portion NO2*b* may be located adjacent to the third fan-out line FL3 when viewed in a plan view.

In addition, the third transmission line PTL2*a* may include a third overlapping portion O2*a* that overlaps the fourth transmission line PTL2*b* when viewed in a plan view, the fourth transmission line PTL2*b* may include a fourth overlapping portion O2*b* that overlaps the third transmission line PTL2*a* when viewed in a plan view, and the third overlapping portion O2*a* may have a width that is relatively larger than that of the third fan-out line FL3 and the fourth fan-out line FL4, respectively.

Referring back to FIGS. 1 to 5, the transmission wiring PTL located in the sealing area SA may include a configuration to be located on the same layer as the gate pattern GE (for example, the first transmission line PTL1*a* and the third transmission line PTL2*a*) and a configuration to be located on the same layer as the capacitor pattern CP (for example, second transmission line PTL1*b* and the fourth transmission line PTL2*b*). Accordingly, when the opening is formed by removing the first to third organic insulating layers 160, 170, and 180 from the sealing area SA, the transmission wiring PTL located in the sealing area SA may not be substantially damaged.

In addition, the first transmission wiring PTL1 may include the first transmission line PTL1*a* and the second transmission line PTL1*b* that are electrically connected to each other, and the second transmission wiring PTL2 may include the third transmission line PTL2*a* and the fourth transmission line PTL2*b* that are electrically connected to each other. As such, as the first transmission wiring PTL1 and the second transmission wiring PTL2 respectively include two transmission wirings located on mutually different layers and electrically connected to each other, the first transmission wiring PTL1 and the second transmission wiring PTL2 may have relatively low resistance, respectively.

In addition, the first transmission line PTL1*a* and the second transmission line PTL1*b* included in the transmission wiring PTL based on the first transmission line PTL1 may be located between the first fan-out line FL1 and the second fan-out line FL2 when viewed in a plan view. Accordingly, a size of the area where the first transmission wiring PTL1, the first fan-out line FL1, and the second fan-out line FL2 are located when viewed in a plan view may be relatively decreased to reduce a dead space at a lower end of the array substrate 100.

In addition, the first non-overlapping portion NO1*a* of the first transmission line PTL1*a* may be adjacent to the second fan-out line FL2 located on a different layer from the first transmission line PTL1*a* based on the first transmission wiring PTL1, and the second non-overlapping portion NO1*b* of the second transmission line PTL1*b* may be adjacent to the first fan-out line FL1 located on a different layer from the second transmission line PTL1*b*. Accordingly, the first transmission line PTL1*a* and the second transmission line PTL1*b* may be respectively spaced apart from the first fan-out line FL1 and the second fan-out line FL2 when viewed in a plan view, and a width of the first transmission line PTL1*a* in the second direction DR2 and a width of the second transmission line PTL1*b* in the second direction DR2 may be relatively large, and thus the resistance of the first transmission wiring PTL1 may become relatively low.

Although the foregoing has been described with reference to embodiments of the present disclosure, those skilled in the art will understood that various modifications and changes can be made within the scope of the present disclosure described in the claims below without departing from the spirit and scope of the present disclosure.

The present disclosure can be applied to various display devices. For example, the present disclosure is applicable to various display apparatuses, such as display devices for vehicles, ships and aircraft, portable communication devices, display devices for exhibition or information transmission, medical display devices, and the like.

| Description of some reference numerals | |
|---|---|
| DA: Display area | PX: Pixel |
| SA: Sealing area | FL1: First fan-out line |
| FL2: Second fan-out line | FL3: Third fan-out line |
| FL4: Fourth fan-out line | FL: Fan-out wiring |
| PTL1a: First transmission line | PTL1b: Second transmission line |
| PTL2a: Third transmission line | PTL2b: Fourth transmission line |
| PTL1: First transmission wiring | PTL2: Second transmission wiring |
| PTL: Transmission wiring | SM: Sealing member |
| NO1a: First non-overlapping portion | NO1b: Second non-overlapping portion |
| NO2a: Third non-overlapping portion | NO2b: Third non-overlapping portion |
| 130: First inorganic insulating layer | 140: Second inorganic insulating layer |
| 150: Third inorganic insulating layer | GE: Gate pattern |
| CP: Capacitor pattern | |

What is claimed is:

1. A display device comprising:

a pixel array in a display area;

a fan-out wiring in a peripheral area adjacent to the display area, and in a sealing area surrounding the display area, and comprising a first fan-out line at a first layer, and a second fan-out line at a second layer;

a transmission wiring in the sealing area, and comprising a first transmission line at the first layer, and a second transmission line at the second layer and electrically connected to the first transmission line, the first transmission line and the second transmission line being between the first fan-out line and the second fan-out line in a plan view, extending in a first direction, and offset from each other in a second direction crossing the first direction; and a sealing member in the sealing area, wherein the second transmission line has an edge extending in the first direction and entirely overlapped by the first transmission line along the first direction.

2. The display device of claim 1, wherein the first transmission line comprises a first non-overlapping portion that does not overlap the second transmission line in the sealing area, and wherein the second transmission line comprises a second non-overlapping portion that does not overlap the first transmission line in the sealing area.

3. The display device of claim 2, wherein the first non-overlapping portion is adjacent to the second fan-out line in plan view, and wherein the second non-overlapping portion is adjacent to the first fan-out line in plan view.

4. The display device of claim 1, wherein the fan-out wiring and the transmission wiring extend in the first direction from the sealing area.

5. The display device of claim 4, wherein the first transmission line comprises an overlapping portion that overlaps the second transmission line in the sealing area in plan view, a width of the overlapping portion in the second direction crossing the first direction, which is an extension direction of the first and second transmission lines, being larger than a width of the first fan-out line in the second direction in the sealing area, and being larger than a width of the second fan-out line in the second direction in the sealing area.

6. The display device of claim 1, wherein the transmission wiring and the fan-out wiring are electrically insulated from each other.

7. The display device of claim 1, wherein the pixel array comprises:

a semiconductor layer;

a first inorganic insulating layer covering the semiconductor layer;

a first conductive layer above the first inorganic insulating layer, and comprising a gate pattern overlapping at least a portion of the semiconductor layer;

a second inorganic insulating layer above the first inorganic insulating layer, and covering the first conductive layer;

a second conductive layer above the second inorganic insulating layer, and comprising a capacitor pattern overlapping at least a portion of the first conductive layer;

a third inorganic insulating layer above the second inorganic insulating layer, and covering the second conductive layer;

conductive layers above the third inorganic insulating layer; and organic insulating layers above the third inorganic insulating layer, and respectively electrically insulating the conductive layers from each other.

8. The display device of claim 7, wherein the gate pattern is at the first layer, and wherein the capacitor pattern is at the second layer.

9. The display device of claim 7, wherein the organic insulating layers define an opening in the sealing area.

10. The display device of claim 9, wherein the sealing member is in the opening.

11. The display device of claim 9, wherein the pixel array covers the conductive layers and the organic insulating layers, and further comprises a first inorganic encapsulation layer, an organic encapsulation layer above the first inorganic encapsulation layer, and a second inorganic encapsulation layer above the organic encapsulation layer.

12. The display device of claim 11, wherein the first inorganic encapsulation layer and the second inorganic encapsulation layer cover the opening in the sealing area.

13. The display device of claim 12, wherein the first inorganic encapsulation layer directly contacts the second inorganic encapsulation layer throughout the sealing area.

14. The display device of claim 1, wherein the peripheral area comprises:

a first peripheral area between the sealing area and the display area;

a second peripheral area surrounding the sealing area; and a bending area adjacent to the second peripheral area.

15. The display device of claim 14, wherein the first transmission line and the second transmission line extend to the first peripheral area, and are electrically connected to each other by a first transmission electrode above the fan-out wiring and the transmission wiring in the first peripheral area.

16. The display device of claim 14, wherein the first transmission line and the second transmission line extend to the second peripheral area, and are electrically connected to each other by a second transmission electrode above the fan-out wiring and by the transmission wiring in the second peripheral area.

17. A display device comprising:

a pixel array in a display area;

a fan-out wiring in a peripheral area adjacent to the display area, and in a sealing area surrounding the display area, and comprising a first fan-out line, a second fan-out line, a third fan-out line, and a fourth fan-out line that extend in a first direction, that are configured to transmit data signals to data lines, and that are alternately arranged in a second direction crossing the first direction in the sealing area;

a transmission wiring that is in the sealing area and comprises a first transmission wiring extending in the first direction and between the first fan-out line and the second fan-out line when viewed in a plan view, and a second transmission wiring between the third fan-out line and the fourth fan-out line when viewed in plan view, the first transmission wiring and the second transmission wiring being configured to transmit a driving signal or power to power lines; and a sealing member in the sealing area, wherein the first transmission wiring comprises a first transmission line and a second transmission line extending in the first direction and offset from each other in the second direction, and wherein the second transmission line has an edge extending in the first direction and entirely overlapped by the first transmission line along the first direction.

18. The display device of claim 17, wherein the first fan-out line and the third fan-out line are at a first layer, and wherein the second fan-out line and the fourth fan-out line are at a second layer.

19. The display device of claim 18, wherein the first transmission line is at the first layer, and the second transmission line is at the second layer and is electrically connected to the first transmission line, and wherein the second transmission wiring comprises a third transmission line at the first layer, and a fourth transmission line at the second layer and electrically connected to the third transmission line.

20. The display device of claim 17, wherein a spacing distance between the second fan-out line and the third fan-out line in the second direction in the sealing area in plan view is less than a spacing distance between the first fan-out line and the second fan-out line in the second direction in the sealing area in plan view, and is less than a spacing distance between the third fan-out line and the fourth fan-out line in the second direction in the sealing area in plan view.

* * * * *